United States Patent [19]

Yamada

[11] Patent Number: 4,615,604
[45] Date of Patent: Oct. 7, 1986

[54] CIRCUIT BOARD FOR ELECTRICAL INSTRUMENT CONTROL

[75] Inventor: Akira Yamada, Tokyo, Japan

[73] Assignee: Canon Kabushiki Kaisha

[21] Appl. No.: 723,651

[22] Filed: Apr. 16, 1985

[30] Foreign Application Priority Data

Apr. 16, 1984 [JP] Japan .............................. 59-56461[U]

[51] Int. Cl.⁴ ........................ G03B 7/00; G03B 15/05; H05K 1/00
[52] U.S. Cl. ................................. 354/485; 354/145.1; 174/68.5; 339/17 R
[58] Field of Search ..................... 354/485, 129, 145.1; 361/397; 174/68.5; 339/17 R

[56] References Cited

U.S. PATENT DOCUMENTS 4,255,691 3/1981 Inagaki et al. .................. 354/145.1
4,297,018 10/1981 Murakami et al. ................... 354/485

Primary Examiner—William B. Perkey
Attorney, Agent, or Firm—Toren, McGeady, Stanger, Goldberg & Kiel

[57] ABSTRACT

A circuit board for electrical instrument control having patterns to which is applied a high voltage. In preventing the high voltage when appearing across the patterns from producing a faulty circuit operation, or damaging circuit elements by leakage, there is no need particularly for separating the high voltage patterns to another circuit board, or adding a circuit for protection against the high voltage, when providing a circuit board deprived of the bad influence of the high voltage patterns.

4 Claims, 3 Drawing Figures

CIRCUIT BOARD FOR ELECTRICAL INSTRUMENT CONTROL

BACKGROUND OF THE INVENTION

1. Field of the Invention

This invention relates to circuit boards for electrical instrument control, and more particularly to such circuit board which has a pattern structure to apply a high voltage thereon.

2. Description of the Prior Art

As the circuit boards for electrical instrument control are often included with the pattern structure to apply the high voltage thereon, this has produced a problem of faulty operations of the other circuits and damages due to leakage. According to the prior known proposals for improvements, the high voltage patterns have been made up in the form of shield wires, and an additional circuit for protection has been incorporated into the board. But such methods have disadvantages in cost and the board area. It has, therefore, been desired to improve them.

In FIG. 1, as an example of the conventional circuit inclucing the pattern structure on which is applied the high voltage there is schematically shown the circuitry of the popular flash unit for camera. In the art of cameras it has been the common practice that the shutter device is provided with a switch 1 for producing an actuating signal for firing the flash unit when the leading curtain of the shutter has run down, or so-called X-synchro switch. When this X-synchro switch 1 is turned on, the trigger circuit in the flash unit produces a firing start signal, thereby the flash tube is caused to emit flash light. The flash unit 100 of FIG. 1 is constructed with a trigger circut 110 of a trigger condenser 112 and a transformer 114, a discharge tube 120, a main condenser 130, a boosting circuit 140, an electrical power source 150 and an adjusting resistor 160. By turning on the X-synchro switch 1, the trigger circuit 110 is actuated, and the boosted voltage by the booster circuit 140 is given through the main condenser 130 to the discharge tube 120 to emit flash light. It will be here understood that at the X-synchro switch 1 there appears the high voltage (usually 300 to 500 volts) for application across the ends of the discharge tube 120. Since the operation of the X-synchro switch 1 is controlled by the shutter control device constituting part of the interior of the camera the high voltage is applied to that pattern structure of the circuit board of the shutter control device which associates with the X-synchro switch 1.

Recently cameras are highly electronized with the use of CPU so that the complicated camera mechanisms are controlled based on the various information inputs from the various interfaces. In the shutter mechanisms, too, the main stream is to the electronically controlled shutter of which the leading and trailing curtains are driven to move by electromagnetic powers. The electrical signals for controlling these mechanisms take the form of very minute current between the interfaces as the electronization advances to high degree. In such electronized camera, however, the use of a circuit arrangement of permitting the high voltage as from the above-described flash unit to be applied to the patterns of the circuit board within the camera provides a source of producing various problems. For example, in the electromagnetic drive type of shutter, when the flash unit turns on in synchronism with the leading curtain running signal to apply the high voltage to the X-synchro switch, the voltage level of the trailing curtain running signal line is caused to vary. As a faulty operation takes place, the trailing curtain runs down. This faulty operation leads to the failure of obtaining the full open aperture of the shutter necessary to make a flash exposure, and, therefore, to a problem that the film frame cannot be exposed uniformly over the entire area thereof. Also, the aforesaid high voltage of the X-synchro switch changes the ground level of the CPU through the ground line from the X-synchro switch, giving a bad influence to the other camera operations, and, in the case of the CPU having RAM, causing the memory to forget.

To improve these drawbacks, according to the prior known proposals, use is made of shield wires between the X-synchro switch and the X-contact of the camera. Another counter-measure is taken that a filter circuit for protection is incorporated into the drive circuit of the shutter. These proposals have produced a new problem of increasing the cost and the area of the circuit board. Also, even when the above-described improvements have been done, it is avoided from the point of view of safety that, in actual practice, the X-synchro switch is put into the circuit board such as that for the shutter drive circuit. As it is separately constructed in another circuit board, when adjusting or checking the shutter unit, the operation has to be carried out by using the above-described shield wire. This results in increasing the number of steps in the assembling process, which in turn builds a large barrier to the progress of automation of assembling and adjusting the shutters. It has, therefore, been strongly desired to improve this.

SUMMARY OF THE INVENTION

An object of the present invention is to realise a circuit board for electrical instrument control which has, despite a pattern structure to which a high voltage is applied and various signal pattern structures are formed on the circuit board, to produce no faulty operation or the like, by low cost and samll area.

Other objects of the invention will become apparent from the following description.

DESCRIPTION OF THE PREFERRED EMBODIMENT

Figure 2:
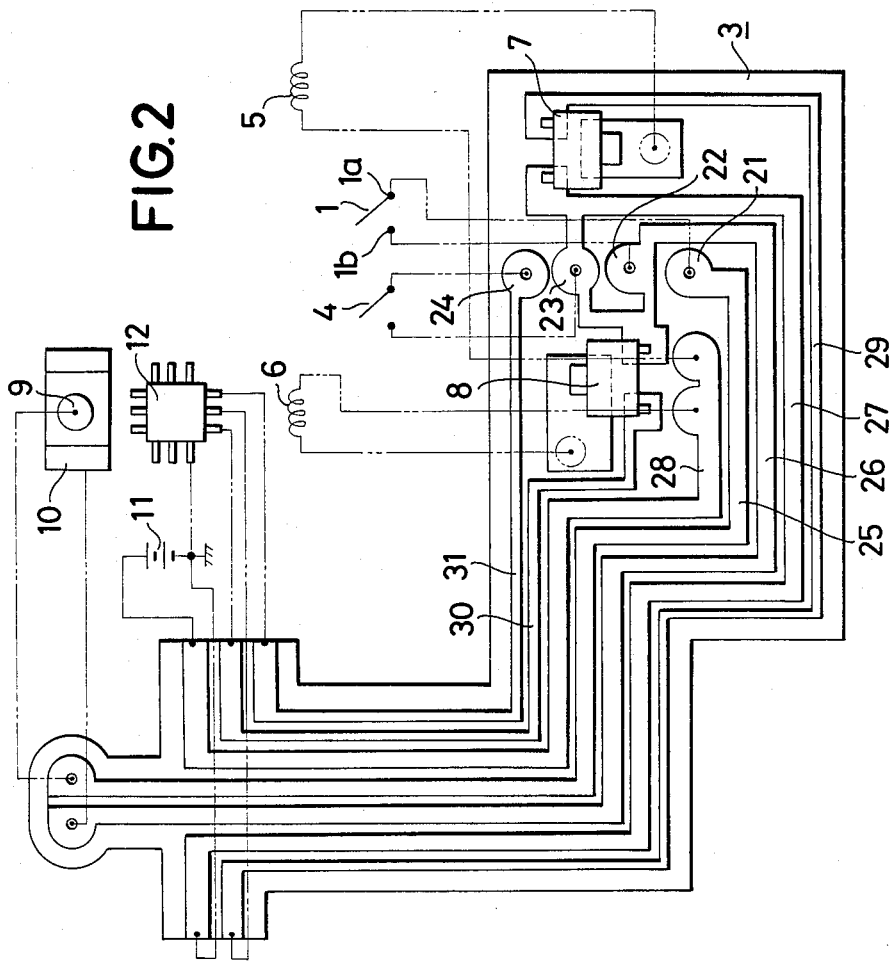
FIG. 2 is a plan view of an embodiment of a shutter circuit board for a camea according to the present invention.

The present invention is next described in detail in connection with an embodiment thereof. The embodiment of the invention is illustrated by the plan view of the shutter circuit board for camera of FIG. 2 and the schematic circuit diagram of FIG. 3.

Figure 3:
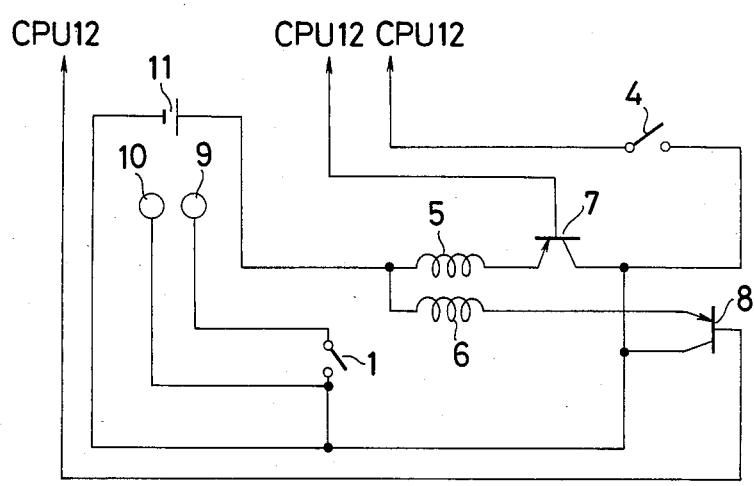
FIG. 3 is a circuit diagram illustrating the embodiment of the invention.

In this illustrated embodiment, the circuit board and the circuit construction are adapted to be used with a shutter of the electromagnetic drive type, and the shutter circuit board 3 has formed thereon an arrangement of various patterns connecting the circuit elements of FIG. 3 with one another.

Figure 1:
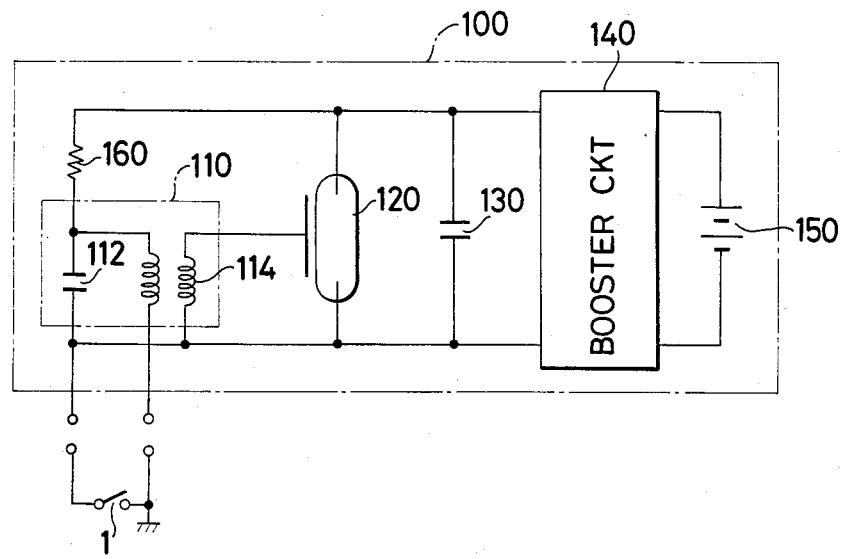
FIG. 1 is an electrical circuit diagram of the general flash unit for camera.

1 is a similar X-synchro switch to that shown in FIG. 1; 4 is a trailing curtain running completion switch; 5 is a leading curtain control magnet; 6 is a trailing curtain control magnet; 7 is a drive control transistor for the leading curtain magnet 5; 8 is a drive control transistor for the trailing curtain magnet 6. As is obvious in FIG. 2, these transistors are of the chip type. 9 is an X-contact in an accessory shoe; and 10 is a ground contact. 11 is an electrical power source loaded within the camera housing; 12 is a CPU for controlling the various functions of the camera; 21 is a land pattern to which is soldered a positive contact 1a of the X-synchro switch 1; 22 is a land pattern to which is soldered a negative contact 1b of the X-synchro switch 1; 23 and 24 are land patterns to which are soldered respective contacts of the trailing curtain running completion switch 4; 25 is an X contact pattern beginning with the land pattern 21 for the positive contact 1a of the X-synchro switch 1 and terminating at a land pattern (with no reference numeral) connected to the X-contact 9 of the accessory shoe. 26 is a ground contact pattern beginning with the land-pattern 22 for the negative contact 1b of the X-synchro switch 1 and terminating at a land pattern (with no reference numeral) connected to the ground contact 10 of the accessory shoe. 27 is a ground signal pattern for the trailing curtain running completion switch 4 and the shutter drive circuit with its one terminal end connected to the electrical power source 11 and the CPU 12 of the camera; 28 is a battery pattern for the shutter drive circuit with its one end connected to the battery 11 and with its other end connected to the leading and trailing curtain control magnets 5 and 6. 29 is a signal pattern for the leading curtain control magnet 5 with its one end connected to the transistor 7 and its other end connected to the CPU 12. 30 is a signal pattern for the trailing curtain control magnet 6 with its one end connected to the transistor 8 and its other end connected to the CPU 12. 31 is a signal pattern for the trailing curtain running completion with its one end at the aforesaid land pattern 24 and its other end connected to the CPU 12.

The arrangement of such patterns is characterized in that the X-contact pattern 25 and the ground contact pattern 26 across which is applied the high voltage the X-synchro switch is turned on are surrounded at one side for the ground contact pattern 26 by the ground signal pattern 27 as an extended pattern from the position of the land pattern 22, and at the other side by the battery pattern 28, and further that the signal patterns 29, 30 and 31 are positioned outside thereof. That is, because such a form that the ground signal pattern 27 and the battery pattern 28 of which the potentials are relatively stable enclose almost of the X-contact pattern 25 and the ground contact pattern 26 is taken, the voltage variation with the use of the flash unit hardly influence the outwardly arranged signal patterns 29, 30 and 31 of minute signals for the shutter drive circuit. This feature of the invention has an advantage of shielding the signal patterns 29 to 31. Another advantage arising the possiblity of putting the X-contact pattern 25 and be ground contact-pattern 26 on the common board of the signal patterns 29, 30 and 31, is that the adjusting and checking of the shutter unit can be carried out with very high an efficiency as compared with the prior art.

It is to be noted that in the embodiment of the invention the reason why, as the pattern for enclosing the X-contact pattern 25 and ground contact pattern 26, use is made of the ground signal pattern 27 and the battery pattern 28, is that, as compared with the conventional idea of using only the ground pattern on both sides of them, it becomes easier to lay out the pattern with an advantage of avoiding involvement of any unduly large increase in the area of the board. Also, while such conventional idea has another problem of producing noise by the magnetic field of the closed loop of the ground pattern, the technique of the invention has no room to produce such a problem.

Another feature of the invention is that the ground signal pattern 27 that flanks the paired ways of the X-contact pattern 25 and the ground contact pattern 26 has the same potential at the ground level and runs, starting from a point near the land pattern 22. Therefore, the high voltage at a time when the flash unit fires applies to the closed loop: the X-contact 9→X-contact pattern 25→ground contact pattern 26→ground contact 10, thereby it being made possible to stablize the ground level of the land pattern 23 and ground signal pattern 27 for the trailing curtain running completion switch 4.

Also, in the embodiment of the invention, the ground signal pattern 27 for producing the shield effect is made not only to function shielding, but also to serve as a ground pattern for the other circuits (transistors 7 and 8). Without the necessity of creating an otherwise wasteful space, the shutter circuit board 3 can be constructed with the limination of its area to a minimum, and with a high efficiency in pattern structure, while still permitting a sufficient shielding effect to be produced.

As has been described above, the present invention is characterized by a circuit board for electrical instrument control having a first pattern structure to which a high voltage is applied, a ground connecting pattern which is formed to enclose one side of the first pattern structure, a battery pattern structure which is formed to enclose the other side of the first pattern structure, and a second pattern for other control circuits which is arranged outside of the ground connecting pattern and the battery pattern. Therefore, the present invention is, despite the pattern structure to which a high voltage is applied is arranged within the common circuit board of the pattern structure for the other control circuts, able to provide a circuit board for electrical instrument control capable of shielding the bad influence of high voltage, and the circuit board, because of no necessity of using a shield wire or adding a circuit for protection as in the prior art, can be of a smaller area than was heretofore required, thus reducing the production cost, and yet can be easily adjusted for various operations.

What is claimed is:

1. An electrical instrument comprising:
   high voltage forming means;
   conductive means connectable to an electrical power source;
   an electrical circuit controlled by a fine signal; and
   a circuit board including;
   (a) a first pattern for receiving a high voltage from said high voltage forming means;
   (b) a pattern for connection to ground and arranged along one side of said first pattern on said board;
   (c) an electrical power source pattern connected to said conductive means for receiving electric power and arranged along the other side of said first pattern so that said pattern for connection to ground and said electric power source pattern substantially surround said first pattern; and
   (d) a second pattern on said circuit board connected to said electrical circuit for transmission of the fine signal, said second pattern being arranged outside of said pattern for connection to ground and said electrical power source pattern.

2. An electrical instrument according to claim 1, wherein said high voltage forming means is a strobe control circuit.

3. An electrical instrument according to claim 2, wherein said first pattern is a pattern for controlling strobe firing.

4. An electrical instrument according to claim 1, wherein said pattern for connection to ground is in the form of two lines arranged along the one side of said first pattern.

* * * * *